(12) United States Patent  
Agawa

(10) Patent No.: US 7,671,683 B2
(45) Date of Patent: Mar. 2, 2010

(54) SEMICONDUCTOR INTEGRATED CIRCUIT AND METHOD FOR ADJUSTING A CAPACITANCE VALUE OF A PHASE COMPENSATING CAPACITOR

(75) Inventor: Kenichi Agawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/047,724

(22) Filed: Mar. 13, 2008

(65) Prior Publication Data

US 2008/0224767 A1 Sep. 18, 2008

(30) Foreign Application Priority Data

Mar. 14, 2007 (JP) ............... 2007-064834

(51) Int. Cl.
*H03F 1/14* (2006.01)
(52) U.S. Cl. ...................... 330/292; 330/260
(58) Field of Classification Search ........... 330/292, 330/254, 260, 279
See application file for complete search history.

(56) References Cited

U.S. PATENT DOCUMENTS 3,836,861 A * 9/1974 Diamond ............... 330/271
6,745,007 B1  6/2004 Kerek
7,459,966 B2 * 12/2008 Nakao ................... 330/9

FOREIGN PATENT DOCUMENTS

JP 10-276050 10/1998
JP 2006-010596 1/2006

OTHER PUBLICATIONS

Japanese Office Action corresponding to U.S. Appl. No. 12/047,724 mailed on Jul. 17, 2009.

* cited by examiner

*Primary Examiner*—Henry K Choe
(74) *Attorney, Agent, or Firm*—Turocy & Watson, LLP

(57) ABSTRACT

A semiconductor integrated circuit has an amplifier circuit which includes a phase compensating capacitor and has a feedback loop, and a stability determining and adjusting circuit which measures an amplitude of a voltage outputted from the amplifier circuit at a predetermined plurality of frequencies and adjusts a capacitance value of the phase compensating capacitor on the basis of a ratio between measured values of the amplitude.

8 Claims, 7 Drawing Sheets

$$|G(\omega)| = \left| \frac{H(\omega)}{1 + \beta H(\omega)} \right|$$

SEMICONDUCTOR INTEGRATED CIRCUIT AND METHOD FOR ADJUSTING A CAPACITANCE VALUE OF A PHASE COMPENSATING CAPACITOR

CROSS REFERENCE TO RELATED APPLICATIONS

This application is based upon and claims the benefit of priority from the prior Japanese Patent Application No. 2007-64834, filed on Mar. 14, 2007, the entire contents of which are incorporated herein by reference.

BACKGROUND OF THE INVENTION

1. Field of the Invention

The present invention relates to a semiconductor integrated circuit and a method for adjusting a capacitance value of a phase compensating capacitor.

2. Related Art

Many of circuits using operational amplifiers are ones with feedback (negative feedback). In a circuit with negative feedback, the negative feedback may change to positive feedback due to phase rotation in a high-frequency band to cause oscillation. For this reason, whether the circuit with a feedback loop has an element satisfying an oscillation condition (the stability of the circuit) is determined.

As a method for determining the stability of a feedback loop, there is available one using phase margin (see, e.g., Japanese Patent Laid-Open No. 2006-10596). In this method, a closed-loop circuit is opened at a point to form an open-loop circuit. A signal is inputted from one end of the open-loop circuit while varying frequency, an output from the other end is obtained, and a loop transfer function is calculated.

A unity gain frequency "fu" where gain is 0 dB (1×) is calculated from the gain-frequency characteristic of the loop transfer function, and the difference between a phase at the unity gain frequency "fu", and a phase lag of 180° is calculated from the phase-frequency characteristic. The difference is phase margin.

If the phase margin is not less than a reference value (e.g., 15°), it is determined that the circuit is oscillation-free and stable. However, a circuit for phase characteristic evaluation is complicated and causes increase in cost.

The process is also performed of setting the capacitance value of a phase compensation capacitor of an operational amplifier to be large, making the phase margin large, and ensuring stability. However, along with increase in the capacitance of a phase compensation capacitor, the gain of a circuit decreases, and the bandwidth becomes narrow. If the capacitance of a phase compensation capacitor is large, slew rate decreases, and distortion occurs in an output waveform.

If device elements, each constituting a part of a circuit, are formed in the manufacturing process to vary widely, phase compensation capacitor samples need to be optimized (adjusted) individually.

SUMMARY OF THE INVENTION

According to one aspect of the present invention, there is provided a semiconductor integrated circuit comprising:

an amplifier circuit which has an amplifier that includes a phase compensating capacitor, amplifies a difference between input voltages from a first input terminal and a second input terminal, and outputs the amplified difference from an output terminal and a feedback loop formed between the first input terminal and the output terminal;

a sine-wave generating section which inputs a sinusoidal voltage to one of the first and second input terminals through a path leading to the one of the first and second input terminals while varying frequency in accordance with a frequency controlling signal;

an amplitude measuring section connected to the output terminal which measures an amplitude of a voltage outputted from the output terminal;

a controlling section which adjusts a capacitance value of the phase compensating capacitor in accordance with a capacitance controlling signal; and a computing section which outputs the frequency controlling signal, calculates a closed-loop gain at a frequency based on the frequency controlling signal from the amplitude measured by the amplitude measuring section and an amplitude of the sinusoidal voltage outputted from the sine-wave generating section, and outputs the capacitance controlling signal to the controlling section such that a ratio of a value of the closed-loop gain at a first frequency to a value of the closed-loop gain at a second frequency that is lower than the first frequency is a predetermined value.

According to one aspect of the present invention, there is provided a semiconductor integrated circuit comprising:

a sine-wave generating section which outputs a sinusoidal voltage while varying frequency in accordance with a frequency controlling signal;

an amplifier circuit which has an amplifier that includes a phase compensating capacitor, amplifies a difference between input voltages from a first input terminal and a second input terminal, and outputs the amplified difference from an output terminal and a first switch which switches between connecting the first input terminal and the output terminal to form a feedback loop and connecting the first input terminal and the sine-wave generating section;

a second switch connected between one of the first and second input terminals and the sine-wave generating section;

an amplitude measuring section connected to the output terminal which measures an amplitude of a voltage outputted from the output terminal;

a controlling section which controls the first and second switches in accordance with a switch controlling signal and adjusts a capacitance value of the phase compensating capacitor in accordance with a capacitance controlling signal; and a computing section which outputs the frequency controlling signal, obtains a loop gain of the amplifier circuit at an arbitrary frequency by outputting the switch controlling signal such that the first input terminal and the sine-wave generating section are connected through the first switch and that the second switch is turned off, calculates a unity gain frequency on the basis of the loop gain, calculates a ratio of a value of a closed-loop gain of the amplifier circuit at the unity gain frequency to a value of the closed-loop gain at a second frequency that is lower than the unity gain frequency by outputting the switch controlling signal such that the first input terminal and output terminal are connected through the first switch to form a feedback loop and that the second switch is turned on, and outputs the capacitance controlling signal to the controlling section such that the ratio is a predetermined value.

According to one aspect of the present invention, there is provided a method for adjusting a capacitance value of a phase compensating capacitor included in a semiconductor integrated circuit comprising:

measuring an amplitude of a voltage outputted from an amplifier circuit which includes a phase compensating capacitor and has a feedback loop at a predetermined plurality frequencies; and adjusting a capacitance value of the phase compensating capacitor on the basis of a ratio between measured values of the amplitude.

DESCRIPTION OF THE EMBODIMENTS

Semiconductor integrated circuits according to embodiments of the present invention will be described below with reference to the drawings.

First Embodiment

Figure 1:
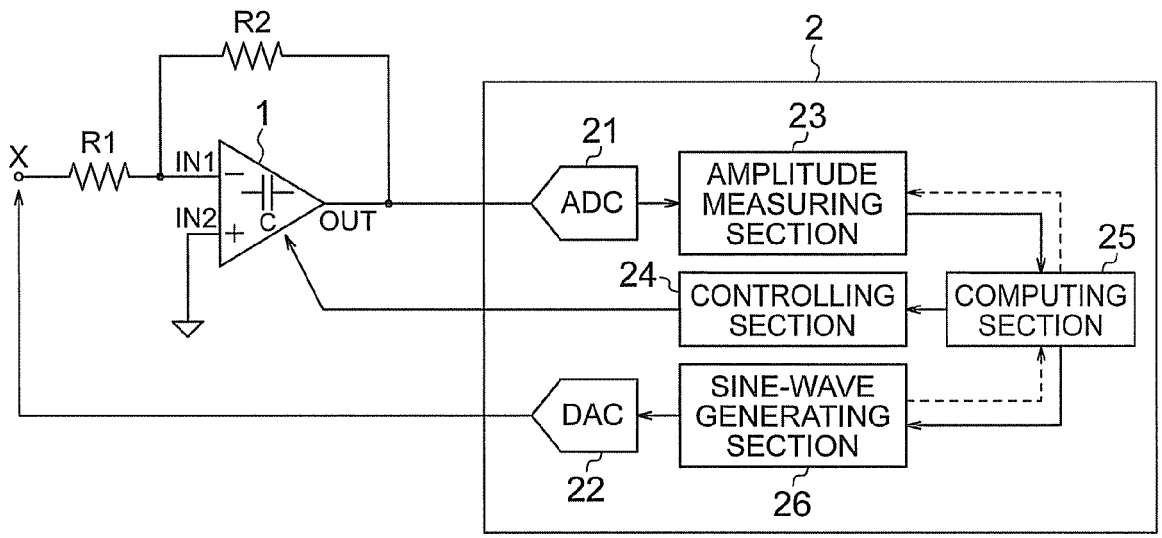
FIG. 1 is a diagram showing the schematic configuration of a semiconductor integrated circuit according to a first embodiment of the present invention.

FIG. 1 shows the schematic configuration of a semiconductor integrated circuit according to a first embodiment of the present invention. The semiconductor integrated circuit includes an amplifier 1, a stability determining and adjusting circuit 2, and resistors R1 and R2. The amplifier 1 includes a phase compensation capacitor C.

The amplifier 1 is an operational amplifier and has an inverting input terminal IN1, a non-inverting input terminal IN2, and an output terminal OUT.

One end of the resistor R1 is connected to a node X while the other end is connected to the inverting input terminal IN1 of the amplifier 1. The node X is a terminal to which an analog signal is inputted from the outside.

An analog signal is inputted from the node X to the inverting input terminal IN1 of the amplifier 1 through the resistor R1. The resistor R2 is connected between the output terminal OUT and the inverting input terminal IN1, and negative feedback is applied to the amplifier 1. The non-inverting input terminal IN2 of the amplifier 1 is grounded.

The stability determining and adjusting circuit 2 has an AD converter 21, a DA converter 22, an amplitude measuring section 23, a controlling section 24, a computing section 25, and a sine-wave generating section 26.

The AD converter 21 is an analog-digital converter. When a signal from the output terminal OUT of the amplifier 1 is inputted to the AD converter 21, the AD converter 21 converts the signal into a digital value and outputs the digital value. The AD converter 21 is also connected to the amplitude measuring section 23 and outputs the digital value to the amplitude measuring section 23.

When the digital value outputted from the AD converter 21 is inputted to the amplitude measuring section 23, the amplitude measuring section 23 measures the magnitude of the digital value. That is, the amplitude measuring section 23 measures the amplitude of a voltage outputted from the amplifier 1 through the AD converter 21.

The computing section 25 is a circuit which measures the closed-loop gain of the amplifier 1 at an arbitrary frequency "ω" and controls the magnitude of the capacitance of the phase compensation capacitor C in the amplifier 1 on the basis of the closed-loop gain. For this reason, an output from the amplitude measuring section 23 is inputted to the computing section 25.

The computing section 25 is also connected to the controlling section 24 and outputs a capacitance controlling signal for controlling the magnitude of the capacitance of the phase compensation capacitor C.

The computing section 25 is further connected to the sine-wave generating section 26 and outputs a frequency controlling signal related to frequency and amplitude to the sine-wave generating section 26.

Alternatively, the sine-wave generating section 26 may determine amplitude information and provide the information to the computing section 25.

Alternatively, the computing section 25 may output frequency information of the frequency controlling signal to the amplitude measuring section 23. The amplitude measuring section 23 refers to the frequency information at the time of measurement of an output from the AD converter 21.

The controlling section 24 controls the capacitance value of the phase compensation capacitor C on the basis of the capacitance controlling signal outputted from the computing section 25.

The sine-wave generating section 26 generates a digital sinusoidal output at an oscillation frequency based on the frequency controlling signal outputted from the computing section 25. The sine-wave generating section 26 outputs the digital output to the DA converter 22.

For example, a numerical controlled oscillator (NCO) is used as the sine-wave generating section 26. This use makes it possible to generate sine waves with a wide range of frequencies.

The DA converter 22 is a digital-analog converter. When the digital sinusoidal output from the sine-wave generating section 26 is inputted to the DA converter 22, the DA converter 22 converts it into a sinusoidal voltage which is an analog value and outputs the sinusoidal voltage. Since the DA converter 22 is connected to the node X, the sinusoidal voltage outputted from the DA converter 22 is inputted to the inverting input terminal IN1 of the amplifier 1 through the resistor R1.

The computing section 25 calculates the closed-loop gain from the ratio between the magnitude (amplitude) of an output sine wave which is designated by the computing section 25 and of which the sine-wave generating section 26 is informed using the frequency controlling signal or that of a sine wave as a digital output outputted from the sine-wave generating section 26 which is included in feedback information from the sine-wave generating section 26 (amplitude information determined by the sine-wave generating section 26) and the magnitude of a digital value outputted from the amplitude measuring section 23.

Figure 2:
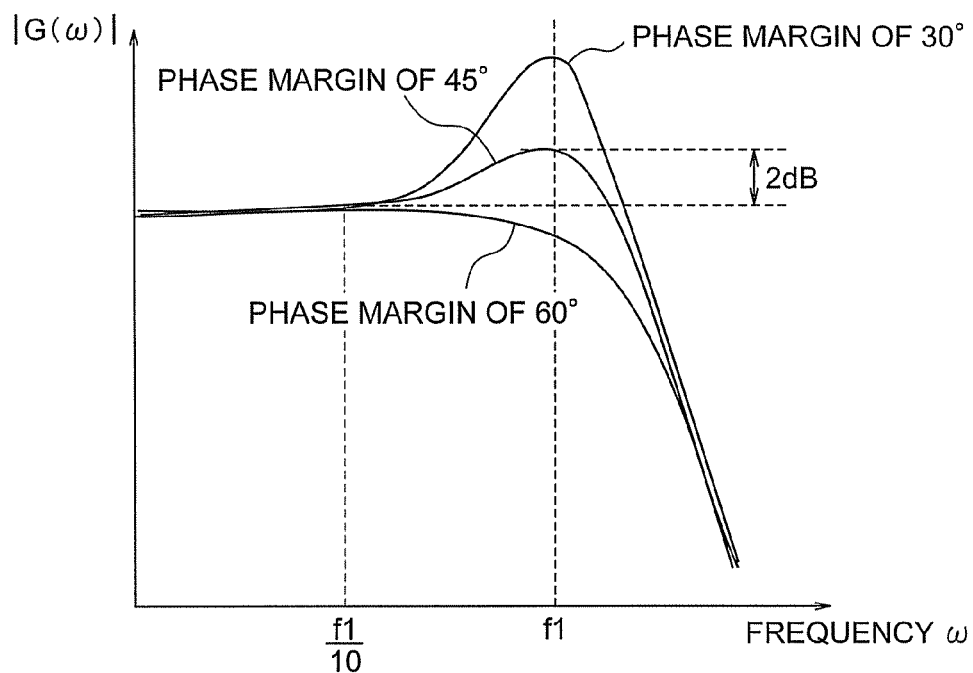
FIG. 2 is a graph showing an example of a closed-loop gain.

Generally, peaking in a closed-loop gain "|G(ω)|" of an operational amplifier becomes more pronounced with decrease in phase margin, as shown in FIG. 2 (the graph is plotted on a logarithmic scale). For example, when the peak value of the gain "|G(ω)|" is about 1.3 times (about 2 dB) a value of the gain "|G(ω)|" in a low-frequency band, the phase margin is about 45°. This embodiment exploits such a closed-loop characteristic. The peak value of a gain "|G(ω)|" and a value of the gain "|G(ω)|" in a low-frequency band are obtained, and the stability of the circuit is determined from the ratio between them.

If the circuit is unstable, i.e., the phase margin is small, the capacitance value of the phase compensation capacitor C is adjusted such that the ratio between the peak value of the gain "|G(ω)|" and the value of the gain "|G(ω)|" in the low-frequency band is equal to a ratio corresponding to a desired phase margin.

For example, if the peak value of the gain "|G(ω)|" is three times the value of the gain "|G(ω)|" in the low-frequency band, and the phase margin is desired to be set to about 45°, the capacitance value of the phase compensation capacitor C is adjusted (the capacitance value is increased) such that the peak value of the gain "|G(ω)|" is about 1.3 times the value of the gain "|G(ω)|" in the low-frequency band.

The sine-wave generating section 26 is caused to output a sinusoidal voltage while varying frequency, e.g., in steps that allow 10 points to be plotted within one order of magnitude on a logarithmic scale. This makes it possible to obtain a change of the gain "|G(ω)|" with a frequency "ω" as shown in FIG. 2.

A frequency "f1" where the gain "|G(ω)|" reaches its peak value is detected. In this embodiment, for example, a frequency band up to a frequency which is one-tenth of the frequency "f1" is set as the low-frequency band, and it is determined that the circuit is stable if the peak value of the gain "|G(ω)|" is not more than 1.3 times (about 2 dB) the value of the gain in the low-frequency band. This ratio corresponds to a phase margin of about 45°.

If the peak value of the gain "|G(ω)|" is more than 1.3 times the value of the gain in the low-frequency band, the computing section 25 determines that the circuit is unstable and outputs, to the controlling section 24, a capacitance controlling signal giving an instruction to increase the capacitance value of the phase compensation capacitor C.

The controlling section 24 controls the capacitance value of the phase compensation capacitor C to increase, in accordance with the capacitance controlling signal. The gain "|G(ω)|" decreases with increase in the capacitance value of the phase compensation capacitor C. The capacitance value is adjusted such that the peak value of the gain "|G(ω)|" is 1.3 times the value of the gain in the low-frequency band.

Alternatively, the adjustment may be performed by initially setting the capacitance value of the phase compensation capacitor C to a large value and gradually reducing the capacitance value of the phase compensation capacitor C until the peak value of the gain "|G(ω)|" becomes 1.3 times the value of the gain "|G(ω)|" in the low-frequency band.

Figure 3:
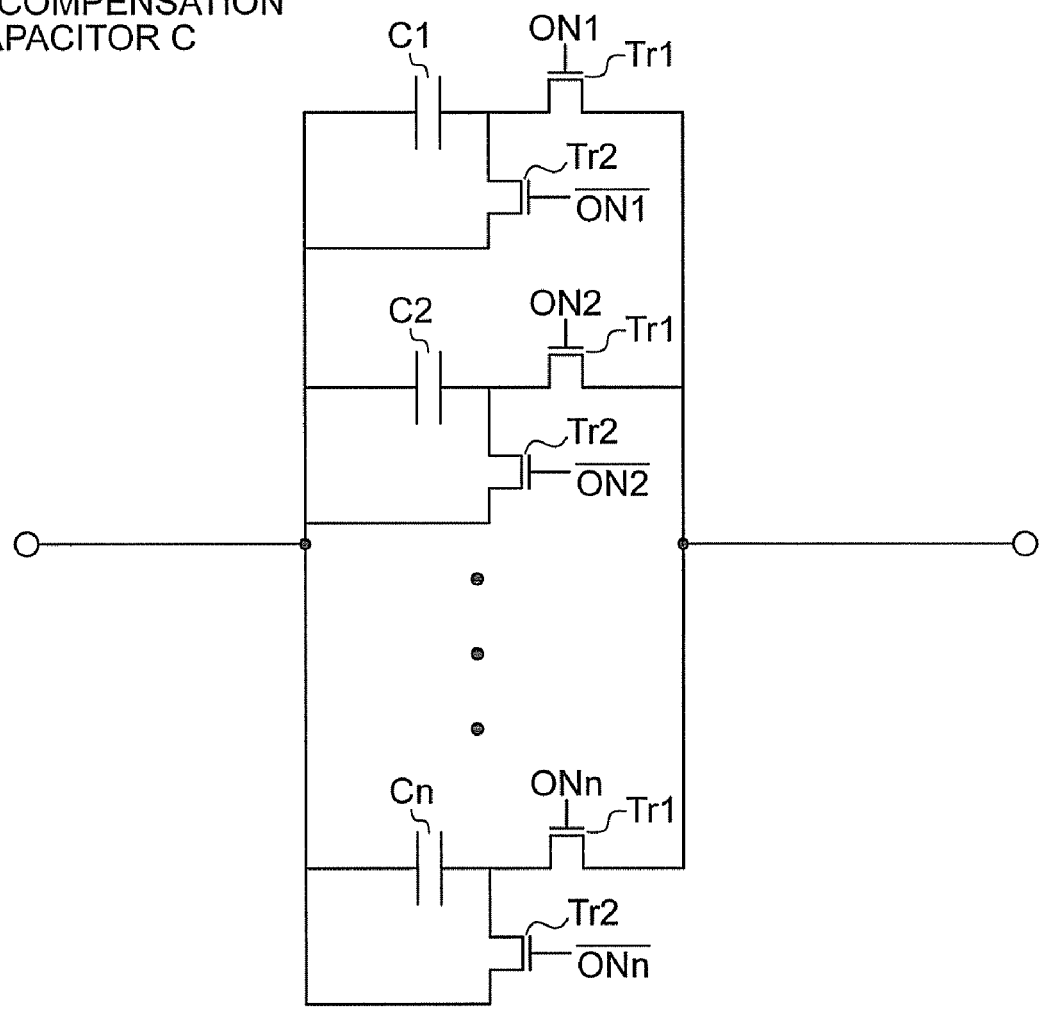
FIG. 3 is a diagram showing the schematic configuration of a phase compensation capacitor.

FIG. 3 shows an example of the configuration of the phase compensation capacitor C. The phase compensation capacitor C has n (n is an integer not less than 2) capacitors C1 to Cn connected in parallel. Each capacitor is connected in series with a switching transistor Tr1 and in parallel with a switching transistor Tr2.

On-off switching signals ON1 to ONn are inputted to gate electrodes of the switching transistors Tr1 to perform on-off control. Inverted on-off switching signals /ON1 to /ONn are inputted to gate electrodes of the switching transistors Tr2 to perform on-off control. If MEMS process can be used, these switches and capacitors may be fabricated by MEMS.

A capacitance controlling signal outputted from the controlling section 24 corresponds to the on-off switching signals. The capacitance value of the phase compensation capacitor C can be adjusted by changing the number of transistors Tr1 to be turned on. The capacitors C1 to Cn may have the same capacitance value. Alternatively, the capacitance values may be set to satisfy the relationship of C1<C2< . . . <Cn.

Figure 4:
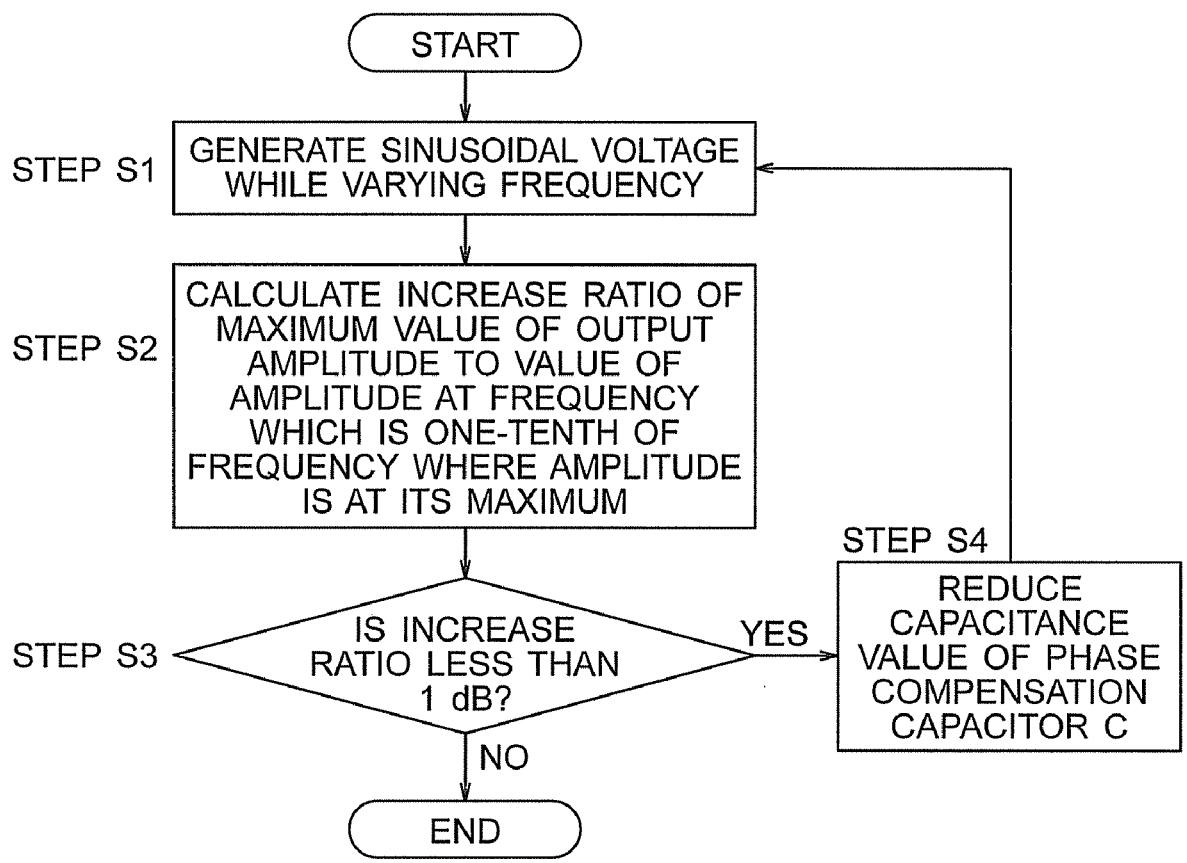
FIG. 4 is a flow chart for adjusting the capacitance value of the phase compensation capacitor.

Methods for adjusting the capacitance value of the phase compensation capacitor C will be described. Assume that the capacitance value is initially set to a large value. An adjustment method for a case where the phase margin is desired to be set to 45° to 55° will be described with reference to the flow chart shown in FIG. 4.

(Step S1) A frequency which is one-tenth of a unity gain frequency expected from the design of the amplifier circuit is set as a start frequency, and a frequency which is the decuple of the unity gain frequency is set as a stop frequency. A sinusoidal voltage is generated from the sine-wave generating section 26 while varying frequency in steps that allow 10 points to be plotted within one order of magnitude on a logarithmic scale.

(Step S2) The amplitude of a voltage outputted from the amplifier 1 at each frequency is measured by the amplitude measuring section 23. The increase ratio of the maximum value of the amplitude to a value of the amplitude at a frequency which is one-tenth of a frequency where the amplitude is at its maximum is calculated.

(Step S3) It is determined whether the increase ratio is less than 1 dB. If the increase ratio is less than 1 dB, the flow advances to step S4. Otherwise, the adjustment ends.

(Step S4) The capacitance value of the phase compensation capacitor C is reduced, and the flow returns to step S1.

Figure 5:
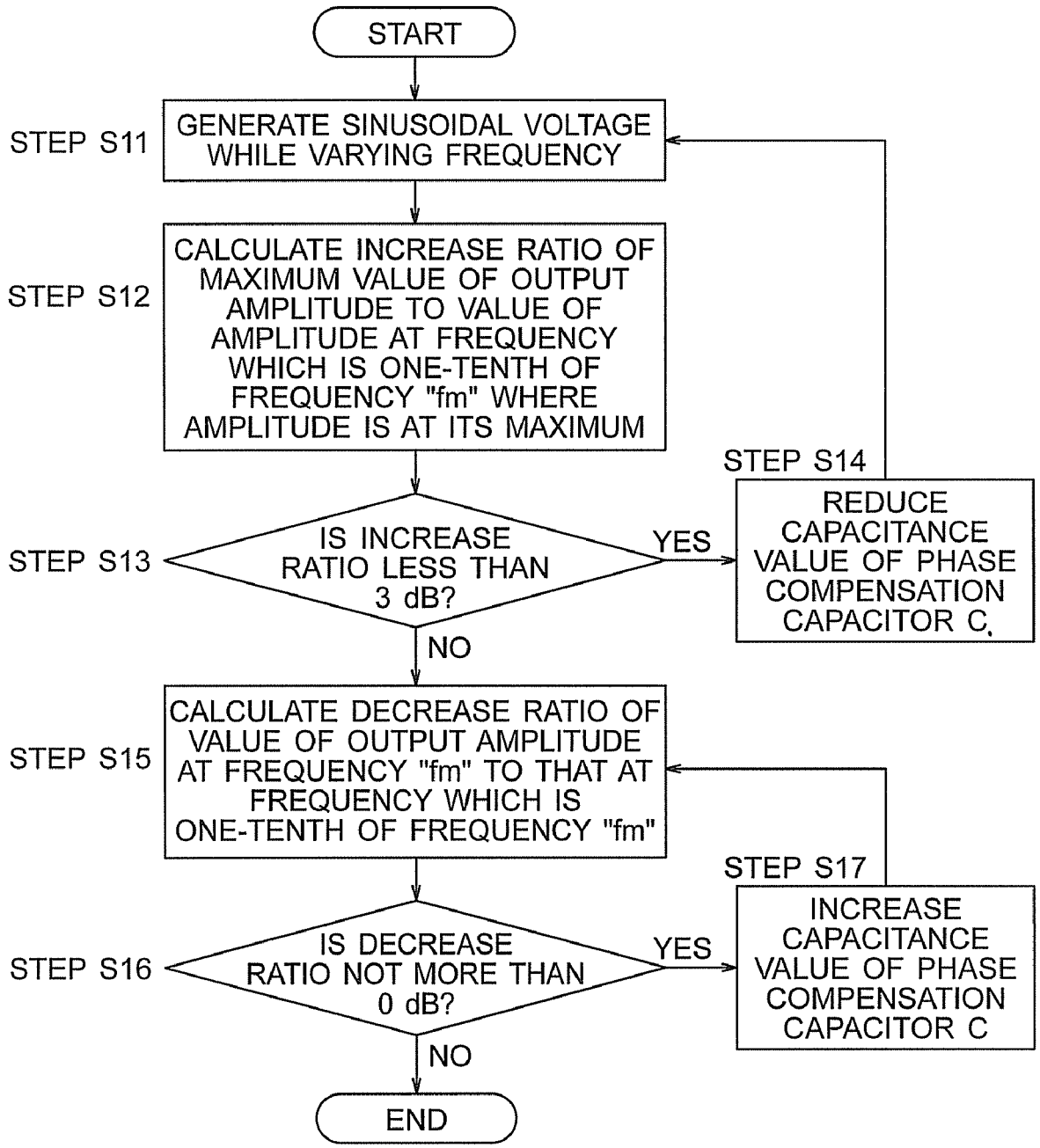
FIG. 5 is a flow chart for adjusting the capacitance value of the phase compensation capacitor.

An adjustment method for a case where the phase margin is desired to be set to 60° to 70° will be described with reference to the flow chart shown in FIG. 5.

(Step S11) A frequency which is one-tenth of a unity gain frequency expected from the design of the amplifier circuit is set as a start frequency, and a frequency which is the decuple of the unity gain frequency is set as a stop frequency. A sinusoidal voltage is generated from the sine-wave generating section 26 while varying frequency in steps that allow 10 points to be plotted within one order of magnitude on a logarithmic scale.

(Step S12) The amplitude of a voltage outputted from the amplifier 1 at each frequency is measured by the amplitude measuring section 23. The increase ratio of the maximum value of the amplitude to a value of the amplitude at a frequency which is one-tenth of a frequency where the amplitude is at its maximum is calculated. Let "fm" be the frequency where the amplitude is at its maximum.

(Step S13) It is determined whether the increase ratio is less than 3 dB. If the increase ratio is less than 3 dB, the flow advances to step S14. On the other hand, if the increase ratio is not less than 3 dB, the flow advances to step S15.

(Step S14) The capacitance value of the phase compensation capacitor C is reduced, and the flow returns to step S11.

(Step S15) The decrease ratio of a value of the output amplitude at the frequency "fm" to a value of the output amplitude at the frequency which is one-tenth of the frequency "fm" is calculated.

(Step S16) It is determined whether the decrease ratio is not more than 0 dB. If the decrease ratio is more than 0 dB, the flow advances to step S17. Otherwise, the adjustment ends.

(Step S17) The capacitance value of the phase compensation capacitor C is increased, and the flow returns to step S15.

It is possible to set the phase margin of the amplifier circuit to a desired value by adjusting the capacitance value of the phase compensation capacitor using such an adjustment method. Note that since the operations in steps S11 to S14 are intended to calculate the frequency "fm" where the output amplitude is at its maximum, the threshold value for the increase ratio in step S13 may be a value other than 3 dB.

As described above, the semiconductor integrated circuit according to this embodiment can determine whether the circuit is stable, without evaluating the phase characteristic and only by measuring the amplitude characteristic. This eliminates the need for a circuit for phase characteristic evaluation and makes it possible to reduce costs.

Since the capacitance value of the phase compensation capacitor can be optimized, it is unnecessary to make the phase margin large, and the bandwidth of the circuit can be increased.

Since, for example, an NCO which is composed of an adder, a multiplier, a flip-flop, a ROM, and the like is used as the sine-wave generating section 26, the semiconductor integrated circuit according to this embodiment can be configured as an on-chip circuit.

The stability is determined from the ratio between a value of the gain "|G(ω)|" at a frequency (hereinafter referred to as a frequency "A") where the closed loop gain reaches its peak value and a value of the gain "|G(ω)|" in a low-frequency band (hereinafter referred to as a frequency "B"). It thus suffices if (absolute values of) the amplitude of a voltage outputted from the output terminal OUT can be measured (obtained) at the frequencies "A" and "B" with high relative accuracy. Since the amplitude of the voltage outputted from the output terminal OUT need not be measured with high accuracy to obtain an absolute value, the size of the circuit can be made smaller than a circuit which requires high absolute accuracy.

A sinusoidal voltage inputted to the amplifier 1 (a digital sinusoidal output outputted from the sine-wave generating section 26) remains the same. Accordingly, the ratio between values of the gain "|G(ω)|" at different frequencies (a relative value) becomes equal to the ratio between values of the amplitude of the voltage outputted from the amplifier 1 at the different frequencies which are measured by the amplitude measuring section 23 through the AD converter 21.

For example, assume that sinusoidal voltages "Vin1" and "Vin2" at the frequency "f1" and a frequency "f2" are inputted to the amplifier 1. Letting "Vout1" and "Vout2" be output voltages and "G1" and "G2" be gains obtained at that time, "G1" can be represented by the equation G1=Vout1/Vin1, and "G2" can be represented by the equation G2=Vout2/Vin2. The ratio between the gains "G1" and "G2", G1/G2 is given by the equation G1/G2=(Vout1·Vin2)/(Vout2·Vin1). If Vin1=Vin2, G1/G2 becomes equal to Vout1/Vout2. This shows that the ratio between values of a gain is equal to the ratio between values of the amplitude of a voltage outputted from the amplifier 1.

Therefore, the stability may be determined using the ratio between values of the amplitude of the voltage outputted from the amplifier 1 which is measured by the amplitude measuring section 23 through the AD converter 21, without calculating the gain "|G(ω)|".

Second Embodiment

Figure 6:
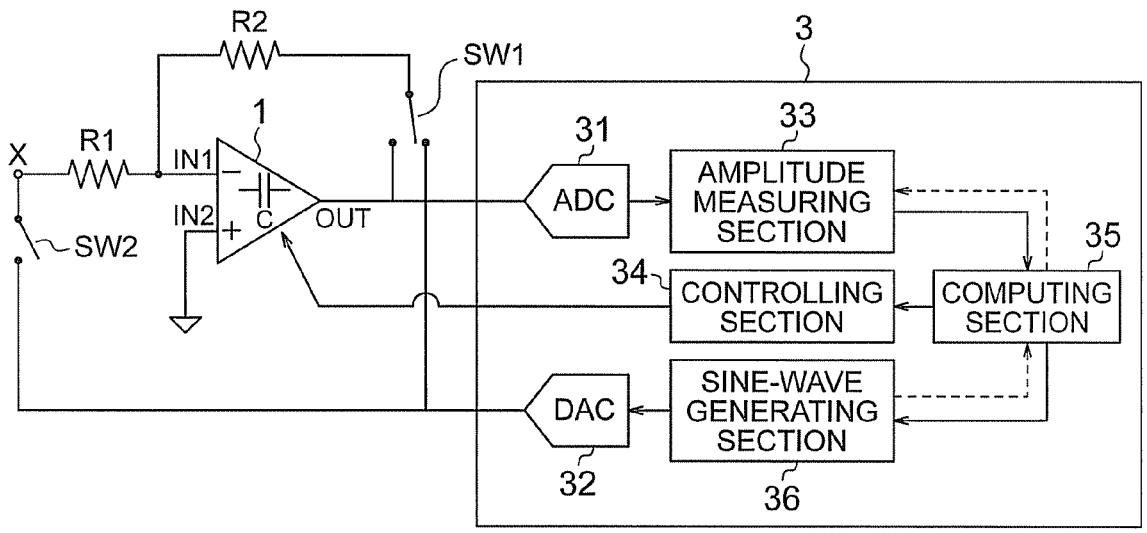
FIG. 6 is a diagram showing the schematic configuration of a semiconductor integrated circuit according to a second embodiment of the present invention.

FIG. 6 shows the schematic configuration of a semiconductor integrated circuit according to a second embodiment of the present invention. The semiconductor integrated circuit includes an amplifier 1, a stability determining and adjusting circuit 3, resistors R1 and R2, and switches SW1 and SW2. The amplifier 1 includes a phase compensation capacitor C.

The amplifier 1 is an operational amplifier and has an inverting input terminal IN1, a non-inverting input terminal IN2, and an output terminal OUT.

One end of the resistor R1 is connected to a node X while the other end is connected to the inverting input terminal IN1 of the amplifier 1. The node X is a terminal to which an analog signal is given from the outside.

An analog signal is inputted from the node X to the inverting input terminal IN1 of the amplifier 1 through the resistor R1. One end of the resistor R2 is connected to the inverting input terminal IN1 of the amplifier 1, and the connection destination of the other end switches between the output terminal OUT of the amplifier 1 and a DA converter 32 by means of the switch SW1. If the other end of the resistor R2 is connected to the output terminal OUT, negative feedback is applied to the amplifier 1. The non-inverting input terminal IN2 of the amplifier 1 is grounded.

The stability determining and adjusting circuit 3 has an AD converter 31, the DA converter 32, an amplitude measuring section 33, a controlling section 34, a computing section 35, and a sine-wave generating section 36. Since the AD converter 31, DA converter 32, amplitude measuring section 33, and sine-wave generating section 36 are the same as the AD converter 21, DA converter 22, amplitude measuring section 23, and sine-wave generating section 26 in the first embodiment, a description thereof will be omitted.

The computing section 35 measures a loop gain "|βH(ω)|" of the amplifier 1 at an arbitrary frequency "ω" and calculates a unity gain frequency "fu" on the basis of the loop gain "|βH(ω)|". As for the loop gain "|βH(ω)|", β represents a feedback factor, and H(ω) represents an open-loop gain (the amplification factor of the amplifier 1 alone). The magnitude of the capacitance of the phase compensation capacitor C in the amplifier 1 is controlled on the basis of values of a closed-loop gain "|G(ω)|" at the unity gain frequency "fu" and in a low-frequency band.

For this reason, an output from the amplitude measuring section 33 is inputted to the computing section 35. The computing section 35 is also connected to the controlling section 34 and outputs a capacitance controlling signal for controlling the magnitude of the capacitance of the phase compensation capacitor C and a switch controlling signal for controlling switching of the states of the switches SW1 and SW2.

The computing section 35 is further connected to the sine-wave generating section 36 and outputs a frequency controlling signal related to frequency and amplitude to the sine-wave generating section 36. Alternatively, the sine-wave generating section 36 may determine amplitude information and provide the information to the computing section 35.

Alternatively, the computing section 35 may output frequency information of the frequency controlling signal to the amplitude measuring section 33. The amplitude measuring section 33 refers to the frequency information at the time of measurement of an output from the AD converter 31.

The controlling section 34 controls the capacitance value of the phase compensation capacitor C in accordance with the capacitance controlling signal outputted from the computing section 35. The controlling section 34 controls switching of the states of the switches SW1 and SW2 in accordance with the switch controlling signal.

The DA converter 32 is connected to the node X through the switch SW2. When the switch SW2 is on, a sinusoidal voltage output from the DA converter 32 is inputted to the inverting input terminal IN1 of the amplifier 1 through the resistor R1. The DA converter 32 can apply the sinusoidal voltage to the resistor R2 through the switch SW1.

The computing section 35 calculates the loop gain "|βH(ω)|" and closed-loop gain "|G(ω)|" of the amplifier 1 from the ratio between the magnitude of a sine wave as a digital output outputted from the sine-wave generating section 36 which is included in feedback information from the sine-wave generating section 36 and that of a digital value outputted from the amplitude measuring section 33.

The loop gain "|βH(ω)|" can be measured by turning off the switch SW2 and switching the state of the switch SW1 such that one end of the resistor R2 is connected to the DA converter 32.

The closed-loop gain "|G(ω)|" can be measured by turning on the switch SW2 and switching the state of the switch SW1 such that the one end of the resistor R2 is connected to the output terminal OUT of the amplifier 1.

Figure 7:
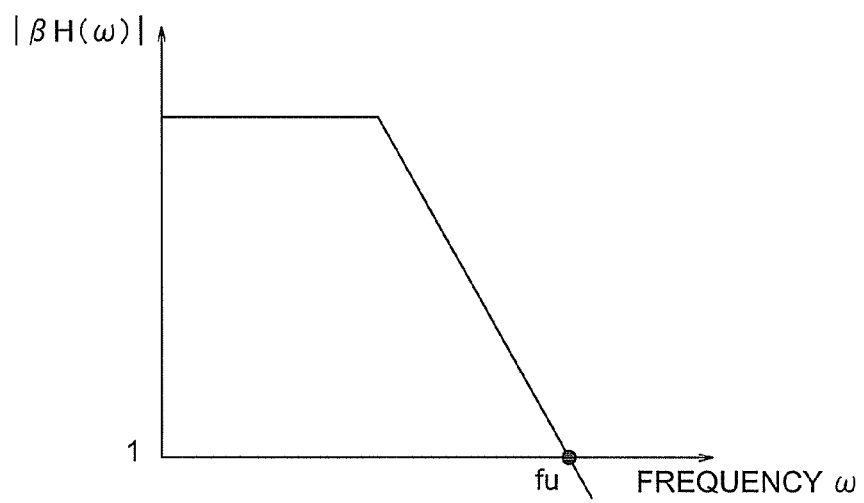
FIG. 7 is a graph showing an example of a loop gain.

Generally, a loop gain "|βH(ω)|" of an operational amplifier decreases at a constant rate with frequency and becomes 1 at a unity gain frequency "fu", as shown in FIG. 7. Since the rate is known from simulation at the time of design, the unity gain frequency "fu" can be easily calculated by measuring the loop gain "|βH(ω)|" at one frequency (a frequency in an area where the loop gain "|βH(ω)|" decreases at the constant rate with frequency).

A closed-loop gain "|G(ω)|" with peaking reaches its peak value at the unity gain frequency "fu". Accordingly, this embodiment measures the closed-loop gain "|G(ω)|" at the unity gain frequency "fu" calculated in the above-described manner and in the low-frequency band (e.g., a frequency which is one-tenth of the frequency "fu") and determines the stability from the ratio between the measured values.

Figure 8:
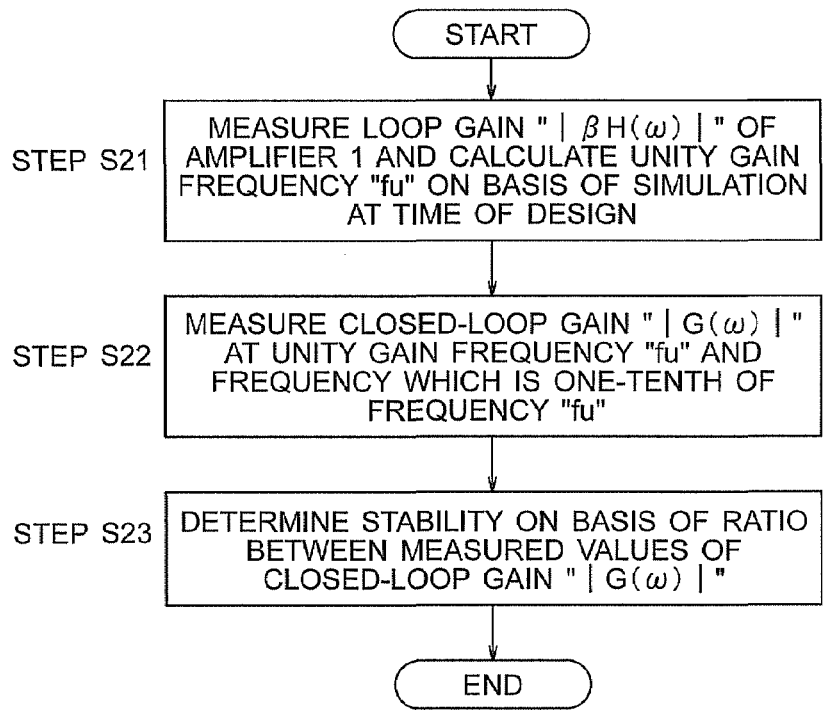
FIG. 8 is a flow chart for determining stability according to the second embodiment.

A method for determining the stability and adjusting the capacitance value of the phase compensation capacitor using the semiconductor integrated circuit will be described with reference to the flow chart shown in FIG. 8.

(Step S21) The switch SW2 is turned off, and the state of the switch SW1 is switched such that a sinusoidal voltage outputted from the DA converter 32 is inputted to the resistor R2. The loop gain "|βH(ω)|" of the amplifier 1 is measured by the computing section 35. The unity gain frequency "fu" is calculated on the basis of simulation at the time of design.

(Step S22) The switch SW2 is turned on, and the state of the switch SW1 is switched such that the output terminal OUT of the amplifier 1 is connected to the resistor R2. The computing section 35 outputs frequency controlling signals to the sine-wave generating section 36 to cause the sine-wave generating section 36 to output a sinusoidal voltage at each of the unity gain frequency "fu" and the frequency which is one-tenth of the unity gain frequency "fu". The computing section 35 measures the closed-loop gain "|G(ω)|" at the unity gain frequency "fu" and the frequency which is one-tenth of the unity gain frequency "fu".

(Step S23) The measured value of the gain "|G(ω)|" at the unity gain frequency "fu" can be regarded as the peak value of the closed-loop gain, and the measured value of the gain "|G(ω)|" at the frequency which is one-tenth of the frequency "fu" can be regarded as a value of the gain in the low-frequency band. If the ratio between the values is not more than a reference value (e.g., 1.3), it is determined that the circuit is stable. On the other hand, if the ratio is more than the reference value, it is determined that the phase margin is small, and the circuit is unstable. The computing section 35 outputs a capacitance controlling signal to the controlling section 34 and adjusts the capacitance value of the phase compensation capacitor C. The adjustment of the capacitance value is the same as that in the first embodiment, and a description thereof will be omitted.

In the first embodiment, it is necessary to measure the gain "|G(ω)|" at a plurality of frequencies and detect one where the gain reaches its peak value. In contrast, in this embodiment, the loop gain "|βH(ω)|" at one frequency is measured, and the unity gain frequency "fu" where the closed-loop gain "|G(ω)|" reaches its peak value is calculated using the measured value. Accordingly, it is possible to reduce the time to determine the stability and adjust the phase compensation capacitor.

Although the unity gain frequency "fu" is calculated by measuring the loop gain "|βH(ω)|" at one frequency in this embodiment, the unity gain frequency "fu" may be calculated with higher accuracy by measuring the loop gain "|βH(ω)|" at a plurality of frequencies.

As described above, the semiconductor integrated circuit according to this embodiment can quickly determine whether the circuit is stable only by measuring the amplitude characteristic. The bandwidth of the circuit can be increased by optimizing the capacitance value of the phase compensation capacitor. Since an NCO is used as the sine-wave generating section 36, the semiconductor integrated circuit of this embodiment can be configured as an on-chip circuit.

Third Embodiment

Figure 9:
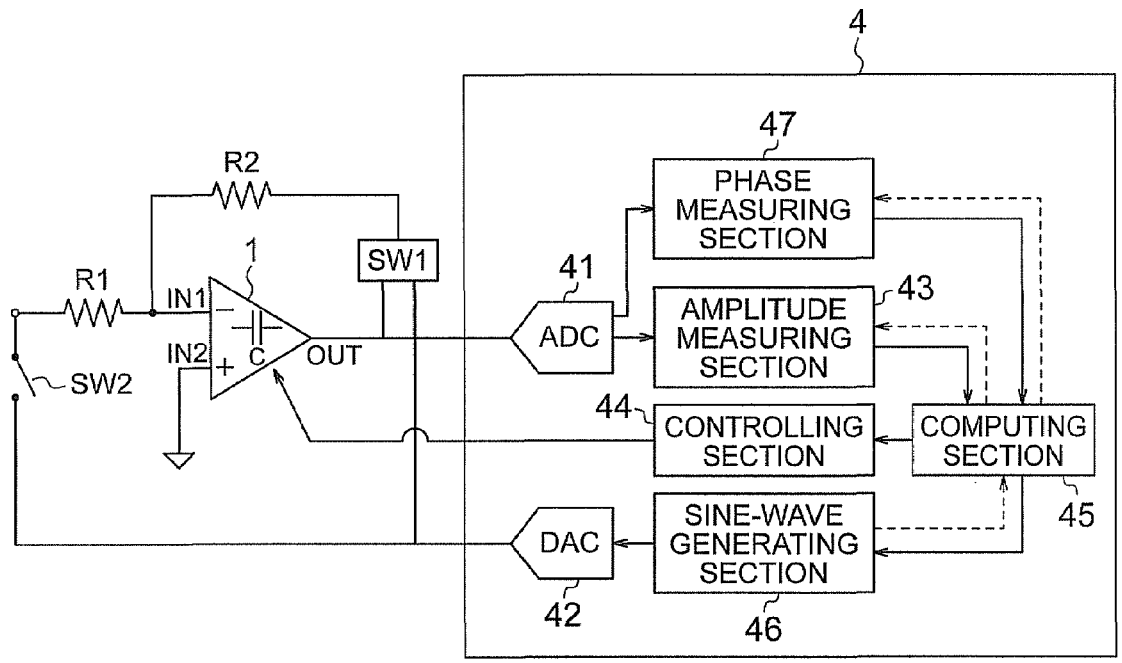
FIG. 9 is a diagram showing the schematic configuration of a semiconductor integrated circuit according to a third embodiment of the present invention.

FIG. 9 shows the schematic configuration of a semiconductor integrated circuit according to a third embodiment of the present invention. The semiconductor integrated circuit includes an amplifier 1, a stability determining and adjusting circuit 4, resistors R1 and R2, and switches SW1 and SW2. The amplifier 1 includes a phase compensation capacitor C.

The stability determining and adjusting circuit 4 has an AD converter 41 which is an analog-digital converter, a DA converter 42 which is a digital-analog converter, an amplitude measuring section 43, a controlling section 44, a computing section 45, a sine-wave generating section 46, and a phase measuring section 47.

One end of the resistor R2 is connected to an inverting input terminal IN1 of the amplifier 1, and the connection destination of the other end switches between an output terminal OUT of the amplifier 1 and the DA converter 42 by means of the switch SW1. The switch SW1 can switch the connection destination between the DA converter 42 and the AD converter 41. Switching of the state of the switch SW1 is controlled by the controlling section 44 in accordance with a switch controlling signal outputted from the computing section 45.

The phase measuring section 47 measures the phase of a voltage outputted from the amplifier 1 or DA converter 42 through the AD converter 41 and outputs the measurement result to the computing section 45.

The relation of connection among the resistor R1, switch SW2, amplitude measuring section 43, sine-wave generating section 46, and the like is similar to that in the semiconductor integrated circuit according to the second embodiment shown in FIG. 6, and a description thereof will be omitted.

A method for determining the stability and adjusting the capacitance value of the phase compensation capacitor using the semiconductor integrated circuit will be described.

First, a unity gain frequency "fu" is calculated in the same manner as in the second embodiment. The computing section 45 outputs a frequency controlling signal to the sine-wave generating section 46 to cause the sine-wave generating section 46 to output a sinusoidal voltage at the frequency "fu".

The switch SW2 is turned off, and the state of the switch SW1 is switched such that an output from the DA converter 42 is inputted to the resistor R2. In this state, a phase "Ph1" of an output from the amplifier 1 is measured by the phase measuring section 47.

The state of the switch SW1 is then switched such that an output terminal of the DA converter 42 and an input terminal of the AD converter 41 are connected. A phase "Ph2" of the output from the DA converter 42 is measured by the phase measuring section 47.

The phase difference between the two measured phases Ph1 and Ph2 is calculated by the computing section 45, and the stability is determined on the basis of the phase margin at the unity gain frequency "fu". The phase compensation capacitor C is adjusted such that the phase difference (or phase margin) is a predetermined value.

The semiconductor integrated circuit according to this embodiment includes the phase measuring section and thus does not achieve cost reduction. However, since the semiconductor integrated circuit can accurately calculate the phase margin, it is possible to calculate an optimum phase compensating capacitance value and obtain a stable, wideband amplifier circuit.

The semiconductor integrated circuit may be configured such that frequency information of the frequency controlling signal is outputted from the computing section 45 to the phase measuring section 47, and the phase measuring section 47 refers to the frequency information at the time of phase measurement.

(Application) The semiconductor integrated circuits according to the above-described embodiments are suitable for application to an amplifier included in a multi-mode wireless transceiver LSI.

Figure 10:
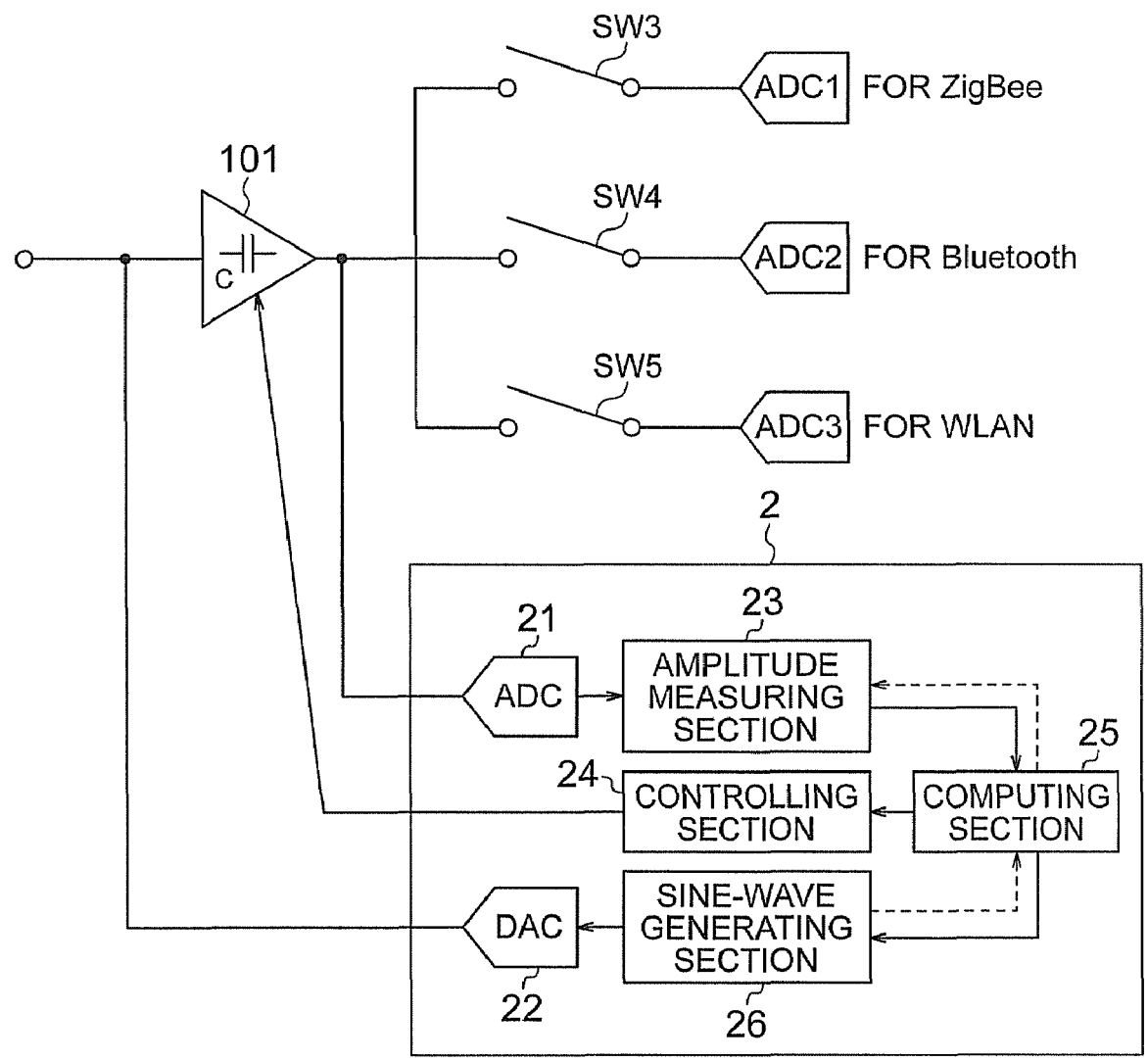
FIG. 10 is a diagram showing an application to an amplifier included in a multi-mode wireless transceiver LSI.

FIG. 10 shows an example in which the semiconductor integrated circuit according to the first embodiment is applied to an amplifier included in a multi-mode wireless transceiver LSI. In the wireless transceiver LSI, analog-digital converters ADC1 to ADC3 for ZigBee, Bluetooth, and WLAN (wireless LAN) are respectively connected to an amplifier 101 through switches SW3 to SW5.

The AD converter 21 and DA converter 22 in the stability determining and adjusting circuit 2 are respectively connected to an output terminal and an input terminal of the amplifier 101. The analog-digital converter ADC1 for ZigBee can be used instead of the AD converter 21. To this end, it suffices to input an output from the analog-digital converter ADC1 to the amplitude measuring section 23 while the switch SW3 is on. This can save the AD converter 21.

By switching the states of the switches SW3 to SW5, the amplifier 1 switches to ZigBee-oriented, Bluetooth-oriented, or WLAN-oriented. At the time of orientation switching, the stability determining and adjusting circuit 2 adjusts the capacitance value of the phase compensation capacitor C of the amplifier 101.

For this reason, the phase compensation capacitor of the amplitude of the wireless transceiver LSI is optimized for each of the orientations, the wireless transceiver LSI can operate efficiently.

Although each of the first to third embodiments has been described using an inverting amplifier, the present invention can also be applied to a configuration using a non-inverting amplifier or differential amplifier.

What is claimed is:

1. A semiconductor integrated circuit comprising:
an amplifier circuit which has an amplifier that includes a phase compensating capacitor, amplifies a difference between input voltages from a first input terminal and a second input terminal, and outputs the amplified difference from an output terminal and a feedback loop formed between the first input terminal and the output terminal;
a sine-wave generating section which inputs a sinusoidal voltage to one of the first and second input terminals through a path leading to the one of the first and second input terminals while varying frequency in accordance with a frequency controlling signal;
an amplitude measuring section connected to the output terminal which measures an amplitude of a voltage outputted from the output terminal;
a controlling section which adjusts a capacitance value of the phase compensating capacitor in accordance with a capacitance controlling signal; and
a computing section which outputs the frequency controlling signal, calculates a closed-loop gain at a frequency based on the frequency controlling signal from the amplitude measured by the amplitude measuring section and an amplitude of the sinusoidal voltage outputted from the sine-wave generating section, and outputs the capacitance controlling signal to the controlling section such that a ratio of a value of the closed-loop gain at a first frequency to a value of the closed-loop gain at a second frequency that is lower than the first frequency is a predetermined value.

2. The semiconductor integrated circuit according to claim 1, wherein the computing section sets, as the first frequency, a frequency where the closed-loop gain reaches a maximum value.

3. The semiconductor integrated circuit according to claim 2, wherein the second frequency is not more than one-tenth of the first frequency.

4. A semiconductor integrated circuit comprising:
a sine-wave generating section which outputs a sinusoidal voltage while varying frequency in accordance with a frequency controlling signal;
an amplifier circuit which has an amplifier that includes a phase compensating capacitor, amplifies a difference between input voltages from a first input terminal and a second input terminal, and outputs the amplified difference from an output terminal and a first switch which switches between connecting the first input terminal and the output terminal to form a feedback loop and connecting the first input terminal and the sine-wave generating section;
a second switch connected between one of the first and second input terminals and the sine-wave generating section;
an amplitude measuring section connected to the output terminal which measures an amplitude of a voltage outputted from the output terminal;
a controlling section which controls the first and second switches in accordance with a switch controlling signal and adjusts a capacitance value of the phase compensating capacitor in accordance with a capacitance controlling signal; and
a computing section which outputs the frequency controlling signal, obtains a loop gain of the amplifier circuit at an arbitrary frequency by outputting the switch controlling signal such that the first input terminal and the sine-wave generating section are connected through the first switch and that the second switch is turned off, calculates a unity gain frequency on the basis of the loop gain, calculates a ratio of a value of a closed-loop gain of the amplifier circuit at the unity gain frequency to a value of the closed-loop gain at a second frequency that is lower than the unity gain frequency by outputting the switch controlling signal such that the first input terminal and output terminal are connected through the first switch to form a feedback loop and that the second switch is turned on, and outputs the capacitance controlling signal to the controlling section such that the ratio is a predetermined value.

5. The semiconductor integrated circuit according to claim 4, wherein the second frequency is not more than one-tenth of the unity gain frequency.

6. The semiconductor integrated circuit according to claim 4, further comprising a phase measuring section connected to the output terminal which measures a phase of a supplied signal, wherein the first switch can be switched to connect the sine-wave generating section and output terminal, and the computing section can output the frequency controlling signal such that a frequency of the sinusoidal voltage outputted by the sine-wave generating section is the unity gain frequency, calculate a phase difference between a phase which is measured by the phase measuring section when the switch controlling signal is outputted such that the sine-wave generating section and the output terminal are connected through the first switch and that the second switch is turned off and a phase which is measured by the phase measuring section when the switch controlling signal is outputted such that the first input terminal and the sine-wave generating section are connected through the first switch and that the second switch is turned off, and output the capacitance controlling signal to the controlling section such that the phase difference is a predetermined value.

7. A method for adjusting a capacitance value of a phase compensating capacitor included in a semiconductor integrated circuit comprising:

measuring an amplitude of a voltage outputted from an amplifier circuit which includes a phase compensating capacitor and has a feedback loop at a predetermined plurality frequencies;

setting, as a first frequency, a frequency where the amplitude of the voltage outputted from the amplifier circuit reaches a maximum value; and adjusting a capacitance value of the phase compensating capacitor on the basis of a ratio between measured values of the amplitude of the maximum value to a value of the amplitude of the outputted voltage at a second frequency which is lower than the first frequency.

8. The method according to claim 7, wherein the second frequency is not more than one-tenth of the first frequency.

* * * * *